(12) United States Patent
He et al.

(10) Patent No.: US 11,754,621 B2
(45) Date of Patent: Sep. 12, 2023

(54) METHOD AND DEVICE FOR WAFER-LEVEL TESTING

(71) Applicant: TAIWAN SEMICONDUCTOR MANUFACTURING COMPANY LTD., Hsinchu (TW)

(72) Inventors: Jun He, Hsinchu (TW); Yu-Ting Lin, Hsin-Chu (TW); Wei-Hsun Lin, Hsinchu County (TW); Yung-Liang Kuo, Hsinchu (TW); Yinlung Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/809,577

(22) Filed: Jun. 29, 2022

(65) Prior Publication Data
US 2022/0326300 A1   Oct. 13, 2022

Related U.S. Application Data

(63) Continuation of application No. 17/198,764, filed on Mar. 11, 2021, now Pat. No. 11,448,692, which is a
(Continued)

(51) Int. Cl.
*G01R 31/28* (2006.01)
*G01R 31/26* (2020.01)

(52) U.S. Cl.
CPC ..... *G01R 31/2879* (2013.01); *G01R 31/2642* (2013.01); *G01R 31/2886* (2013.01)

(58) Field of Classification Search
CPC ............ G01R 31/2879; G01R 31/2886; G01R 31/2601; G01R 31/2642; G01R 31/2858
(Continued)

(56) References Cited

U.S. PATENT DOCUMENTS 5,057,441 A * 10/1991 Gutt ........................ H01L 22/20
438/18
5,707,881 A * 1/1998 Lum ................... G01R 31/2831
438/107

(Continued)

FOREIGN PATENT DOCUMENTS

EP            348099 A  * 12/1989   ......... G11C 16/0433
EP        0348099 A2      12/1989
(Continued)

*Primary Examiner* — Christopher P McAndrew
(74) *Attorney, Agent, or Firm* — WPAT LAW; Anthony King

(57) ABSTRACT

The present disclosure provides a method and a system for testing semiconductor device. The method includes providing a device under test (DUT) having an input terminal and an output terminal; applying a voltage having a first voltage level to the input terminal of the DUT during a first period; applying a stress signal to the input terminal of the DUT during a second period subsequent to the first period; obtaining an output signal in response to the stress signal at the output terminal of the DUT; and comparing the output signal with the stress signal. The stress signal includes a plurality of sequences, each having a ramp-up stage and a ramp-down stage. The stress signal has a second voltage level and a third voltage level.

19 Claims, 13 Drawing Sheets

Related U.S. Application Data continuation-in-part of application No. 16/522,551, filed on Jul. 25, 2019, now Pat. No. 11,073,551.

(60) Provisional application No. 63/115,280, filed on Nov. 18, 2020, provisional application No. 63/092,743, filed on Oct. 16, 2020, provisional application No. 62/719,044, filed on Aug. 16, 2018.

(58) Field of Classification Search
USPC .................................................. 324/750.01
See application file for complete search history.

(56) References Cited

U.S. PATENT DOCUMENTS

| | | | | |
|---|---|---|---|---|
| 5,732,209 | A * | 3/1998 | Vigil | G01R 31/318566 714/30 |
| 6,714,032 | B1 * | 3/2004 | Reynick | G01R 31/3008 324/762.02 |
| 6,747,471 | B1 * | 6/2004 | Chen | G01R 31/2856 324/750.05 |
| 8,237,462 | B2 * | 8/2012 | Hung | G01R 31/3004 324/762.01 |
| 9,176,167 | B1 * | 11/2015 | Chen | G01R 3/00 |
| 9,322,847 | B2 * | 4/2016 | Hamilton | G06F 11/2263 |
| 10,126,354 | B1 * | 11/2018 | Kerber | G01R 31/2855 |
| 2003/0237061 | A1 * | 12/2003 | Miller | G01R 31/31718 438/18 |
| 2004/0266086 | A1 * | 12/2004 | Boone | H01S 5/041 257/E33.044 |
| 2006/0234398 | A1 * | 10/2006 | Gluschenkov | H01L 21/67294 118/712 |
| 2008/0007284 | A1 * | 1/2008 | Balog | G01R 31/318511 324/762.03 |
| 2008/0278190 | A1 * | 11/2008 | Ong | G01R 31/2851 257/E23.002 |
| 2009/0134880 | A1 * | 5/2009 | Grund | G01R 31/002 324/537 |
| 2009/0167339 | A1 * | 7/2009 | Marshall | G01R 31/3025 324/754.29 |
| 2010/0032647 | A1 * | 2/2010 | Khan | H01L 33/32 438/47 |
| 2010/0182859 | A1 * | 7/2010 | Kohler | G11C 8/08 365/201 |
| 2011/0037494 | A1 * | 2/2011 | Hung | G01R 31/3004 324/762.05 |
| 2014/0062515 | A1 * | 3/2014 | Vassighi | G01R 31/2879 324/750.05 |
| 2016/0377674 | A1 * | 12/2016 | Bickford | G05B 19/4188 324/750.01 |
| 2017/0350938 | A1 * | 12/2017 | Kang | G01R 31/2858 |
| 2018/0145271 | A1 * | 5/2018 | Kedem | C08K 3/045 |
| 2018/0328979 | A1 * | 11/2018 | Briggs | G01R 31/2642 |
| 2019/0013252 | A1 * | 1/2019 | Abraham | G01R 31/31713 |
| 2019/0265293 | A1 * | 8/2019 | Fifield | G01R 31/2642 |

FOREIGN PATENT DOCUMENTS

| | | |
|---|---|---|
| EP | 348099 A3 | 12/1989 |
| EP | 0348099 A3 | 8/1990 |
| EP | 00348099 B1 | 8/1994 |
| KR | 1020000026475 A | 5/2000 |
| KR | 1020030089021 A | 11/2003 |
| KR | 1020110021892 A | 3/2011 |
| KR | 1020140031075 A | 3/2014 |
| KR | 1020150073460 A | 7/2015 |

* cited by examiner

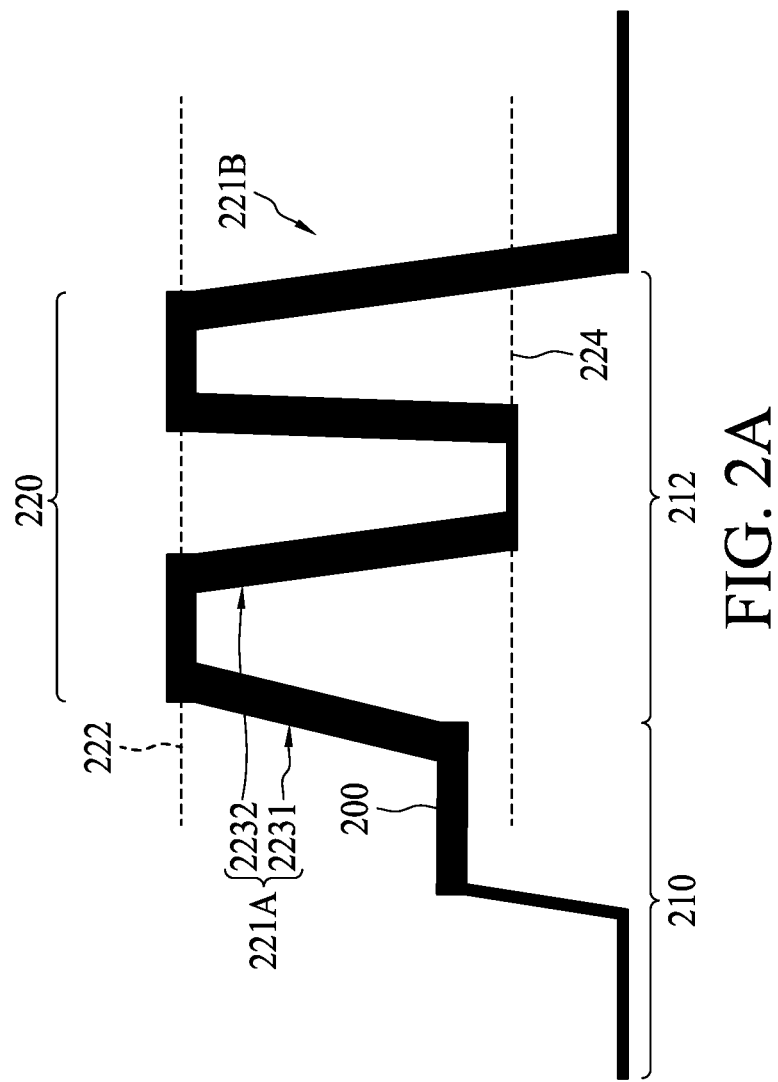

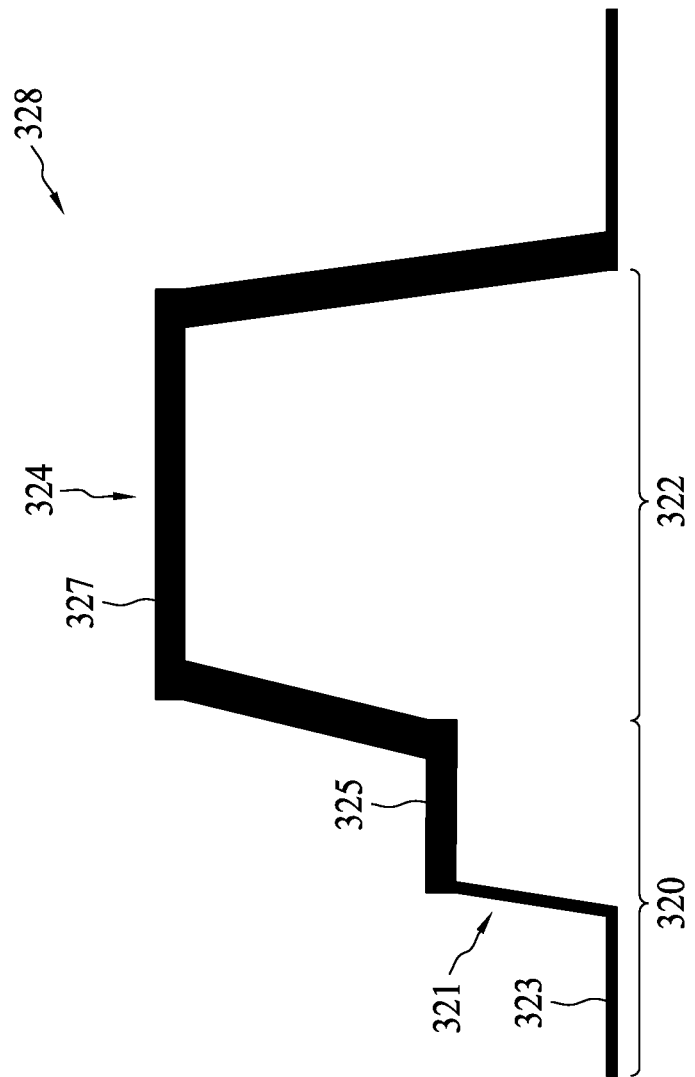
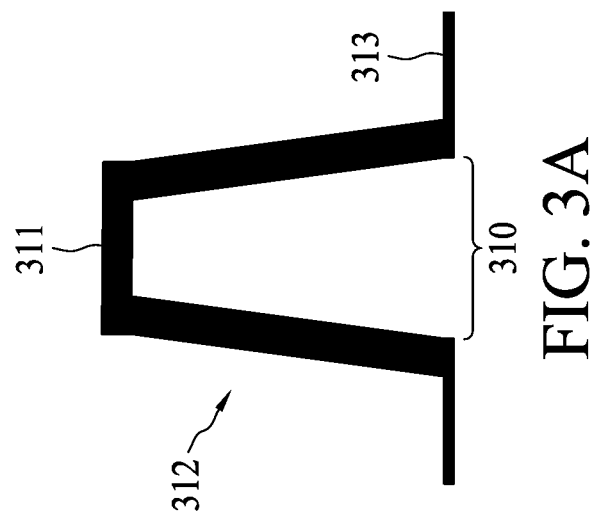

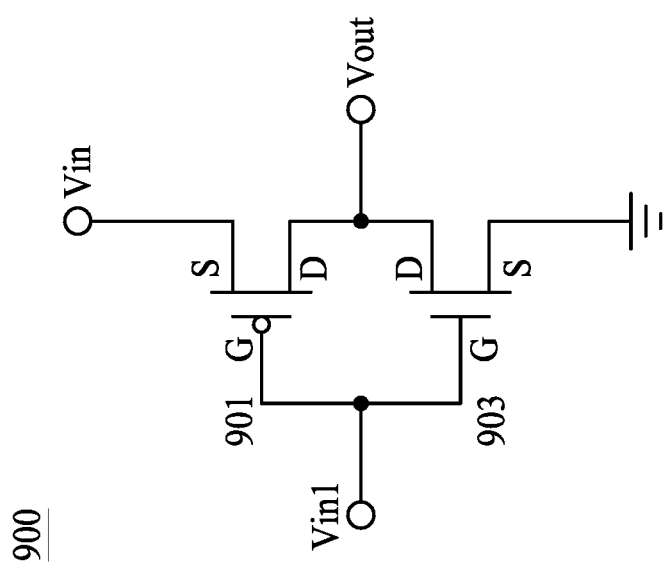

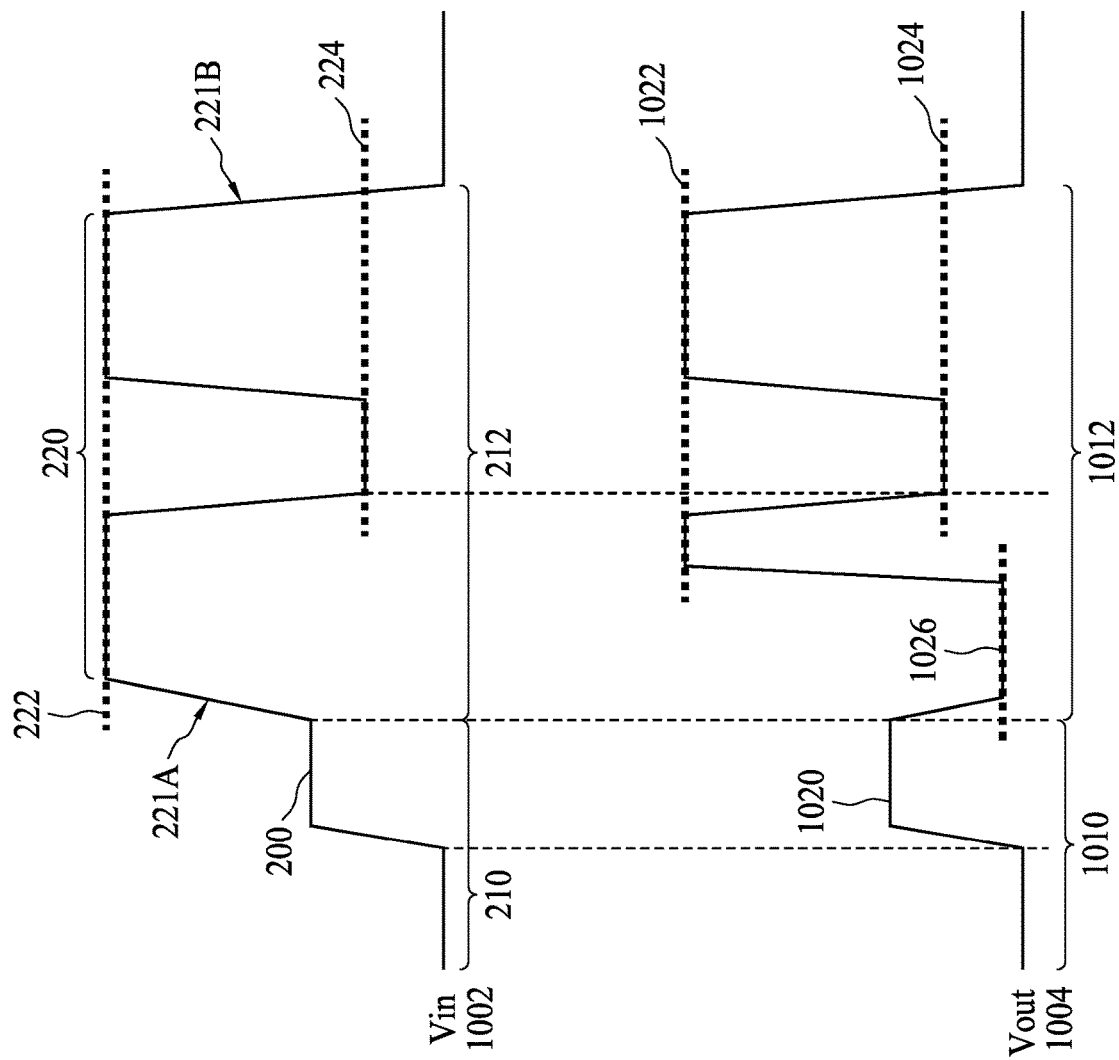

METHOD AND DEVICE FOR WAFER-LEVEL TESTING

PRIORITY CLAIM AND CROSS-REFERENCE

This application claims is a continuation of prior-filed U.S. application Ser. No. 17/198,764, filed Mar. 11, 2021, and claims the benefit of the prior-filed provisional application No. 62/719,044 filed on Aug. 16, 2018, the prior-filed application Ser. No. 16/522,551 filed on Jul. 25, 2019, which is incorporated by reference in its entirety, the prior-filed provisional application No. 63/092,743 filed on Oct. 16, 2020, and the prior-filed provisional application No. 63/115,280 filed on Nov. 18, 2020.

BACKGROUND

In semiconductor fabrication, a wafer typically undergoes numerous processes to form an integrated circuit. Various wafer-level tests are performed to determine performance and reliability of the integrated circuit under various conditions and wafer acceptance. Wafer-level reliability testing is utilized for detecting potential for early failure associated with defects generated during fabrication of the integrated circuit. Generally, reliability testing involves stressing the integrated circuit using various techniques such as on/off power cycling and applying voltages that exceed normal operating conditions. However, current testing techniques may provide invalid reliability assessment due to unexpected damage or degradation of the integrated circuit during testing. Therefore, it is desirable to develop a more effective stressing method for testing.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A is an illustration of a multiple-step power signal for testing a wafer in accordance with some embodiments of the present disclosure.

FIG. 3A is an illustration of a single-step power signal for testing a wafer in the conventional dynamic voltage stress test method.

FIG. 3B is an illustration of a single-step power signal for testing a wafer in the conventional elevated voltage stress test method.

FIG. 9 is an illustration of an inverter circuitry in accordance with some embodiments of the present disclosure.

FIG. 10 is a timing chart illustrating the waveform of the input and output signals in accordance with the embodiment in FIG. 9.

DETAILED DESCRIPTION

Figure 1:
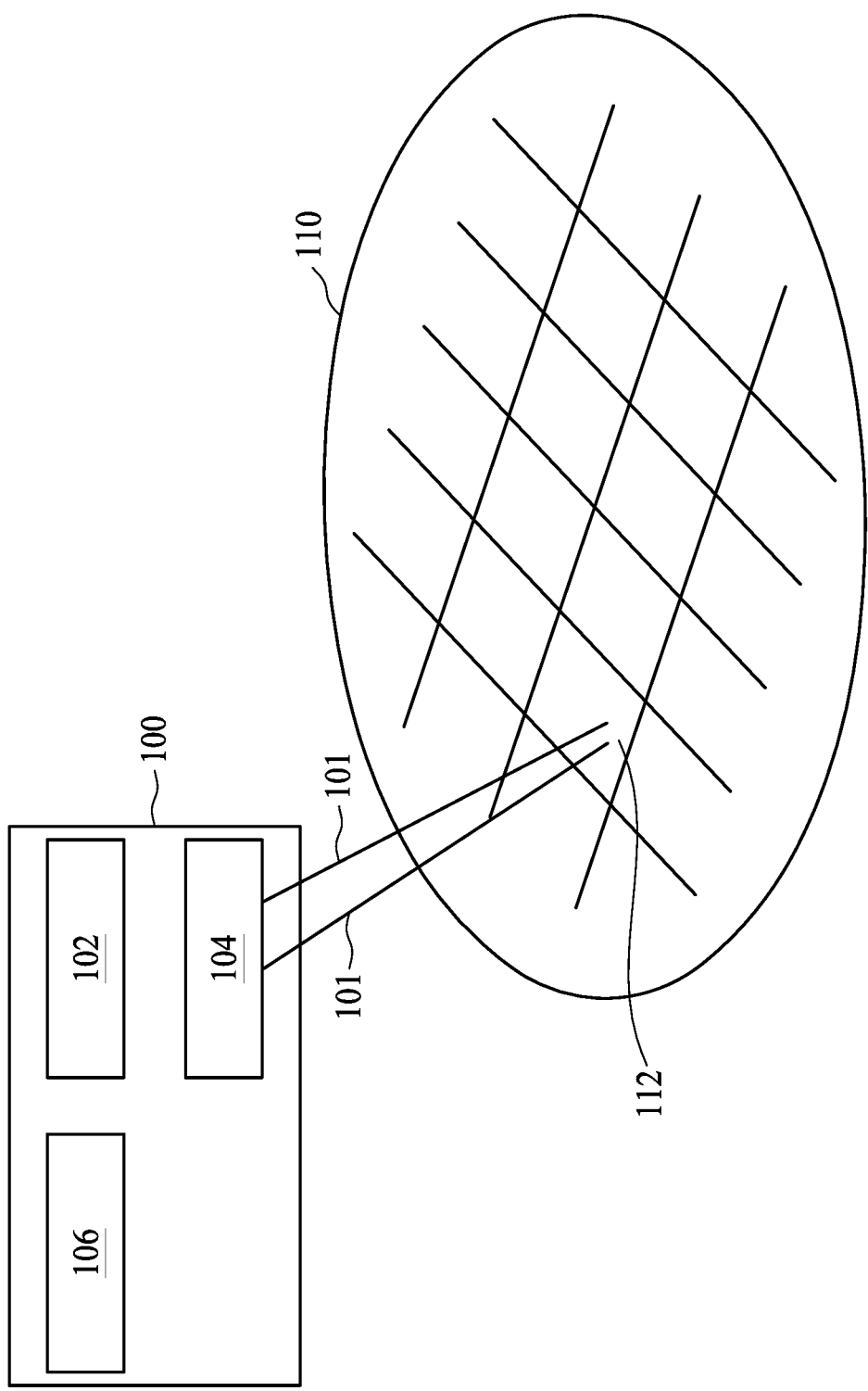
FIG. 1 is a diagrammatic view of a system for testing semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some conventional voltage stress tests, the screen rate (i.e., the fail count divided by the total device numbers) for wafer-level testing may need to be improved. It is discovered that rapidly changing the toggle state (i.e., "0" state or "1" state) of the semiconductor devices in the integrated circuit (IC) may improve the screen rate for wafer-level testing. According to some embodiments of the present disclosure, the signal generator may provide a cyclic alternating voltage stress (CAVS) that the stress signal having a plurality of sequences, which cause the voltage level to alternately fluctuate between a high voltage level and a low voltage level in a time period. The toggle state (i.e., "0" state or "1" state) of the semiconductor devices in the integrated circuit (IC) may be changed more easily by the CAVS during the multiple ramp-up and ramp-down stages. The reason is that the field effect is alternated locally. As a result, the stress signal may cause some of the semiconductor devices to become a short mode as a fail count. The swap rate of the semiconductor devices in the IC may be increased due to the multiple ramp-up and ramp-down stages. Thus, the screen rate for wafer-level testing may be improved.

FIG. 1 is a diagrammatic view of a system 100 for testing a semiconductor device in accordance with some embodiments of the present disclosure. FIG. 2A is an illustration of a multiple-step power signal for testing a wafer in accordance with some embodiments of the present disclosure.

Referring to FIG. 1 and FIG. 2A, the system 100 is configured to test an integrated circuit (IC) formed on a wafer 110. The wafer 110 may be referred to as a device under test (DUT). The wafer 110 may comprise an elementary semiconductor such as silicon, germanium, or diamond. The wafer 110 may include one or more ICs 112 (or chips) formed thereon. Scribe lines may be provided between adjacent ICs 112 so that the ICs can be separated in subsequent processing.

In some embodiments, the system 100 may be automatic test equipment (ATE). The system 100 may include hardware and software components that provide a suitable operational and functional environment for the tests. In some embodiments, the system 100 includes a signal generator 102, a coupler 104 and a module 106.

The signal generator 102 is configured to generate a cyclic alternating voltage stress (CAVS). The CAVS includes a signal of a first voltage level 200 during a first period 210 and a stress signal 220 during a second period 212 subsequent to the first period 210. It should be understood that other electrical signals such as data signals and clock signals may be provided to the DUT but are not illustrated for the sake of clarity and simplicity.

In some embodiments, during the first period 210, a single-step signal that rises from ground (i.e., 0 V) to a first voltage level 200 is generated. The first voltage level 200 may be the nominal voltage or high voltage (for example, 5~10% of nominal voltage higher) of the IC 112. The IC 112 may be energized with the nominal voltage for a power cycling test. In some embodiments, the duration of rising from ground to the first voltage level 200 may be in milliseconds level based on voltage slew rate.

In some embodiments, during the second period 212, the stress signal 220 is generated. The stress signal 220 functions to overstress the DUT and induce failures associated with the fabrication process. The stress signal 220 may include a plurality of sequences 221A and 221B. Each of the sequences 221A and 221B includes a ramp-up stage 2231 and a ramp-down stage 2232. Each of the sequences 221A and 221B includes a change in voltage between a second voltage level 222 and a third voltage level 224. A range of the ramp-up stage 2231 or the ramp-down stage 2232 is not limited. In some embodiments, the range of the ramp-up stage 2231 or the ramp-down stage 2232 is between about 0.1 V/millisecond (ms) and about 0.3 V/ms. The ramp-up stage 2231 raises the voltage from the first voltage level 200 to the second voltage level 222, and the ramp-down stage 2232 decreases the voltage from the second voltage level 222 to the third voltage level 224.

It should be understood that the stress signal may vary depending on test requirements and/or historical data. For example, the stress signal may depend on the defect parts-per-million (DPPM). In some industries, the defect tolerance may be lower, e.g., in the automobile or mobile phone industry, and the sequences of the stress signal may be increased. The second voltage level 222 is higher than the first voltage level 200. The value of the second voltage level 222 is not limited. In some embodiments, the second voltage level 222 may be about 1.3 times higher, about 1.58 times higher, about 2.0 times higher, or about 3.0 times higher than the first voltage level 200. The second voltage level 222 serves as a test voltage (or stress voltage). The value of the third voltage level 224 is not limited. The third voltage level 224 is lower than the second voltage level 222. In some embodiments, the third voltage level 224 may be equal to or lower than the first voltage level 200. In some embodiments, a voltage difference between the second voltage level 222 and the third voltage level 224 is greater than a voltage difference between the first voltage level 200 and the second voltage level 222. In some embodiments, the third voltage level 224 may be about 0.7 times the first voltage level 200. In some embodiments, the third voltage level 224 may be about 0.9 times the second voltage level 222. A duration of the third voltage level 224 may include a waiting time and a check alarm time. The duration of the third voltage level 224 is not limited and can be treated as cooling time to suppress self-heating effect caused by voltage stress. In some embodiments, the duration of the third voltage level 224 may be about 6~10 within or over hundreds ms.

Figure 2B:
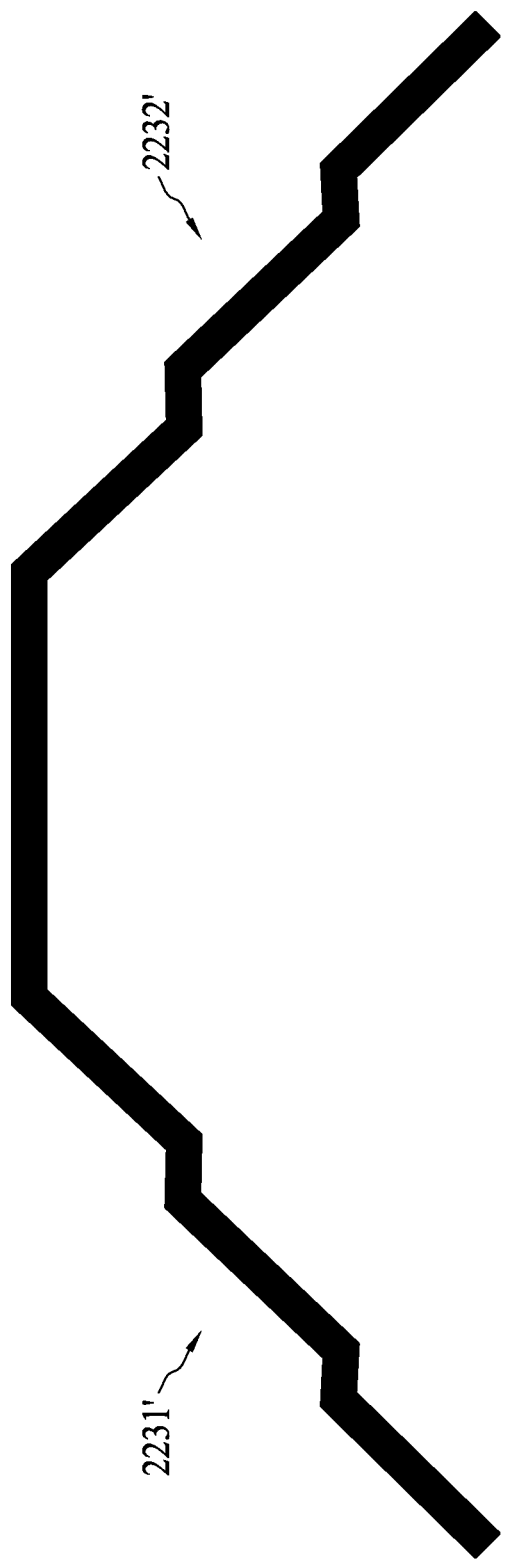
FIG. 2B is an illustration of a multiple-step ramp-up and ramp-down stages of the sequence in accordance with some embodiments of the present disclosure.

FIG. 2B is an illustration of a multiple-step ramp-up and ramp-down stages of the sequence in accordance with some embodiments of the present disclosure. Referring to FIG. 2B, in some embodiments, the ramp-up stage 2231' and the ramp-down stage 2232' includes multiple steps. With multiple steps, the current overshoot may be avoided. It should be noted that the number of steps of the ramp-up stage 2231' and the ramp-down stage 2232' are not limited.

Referring back to FIG. 1 and FIG. 2A, the coupler 104 is configured to couple the signal generator 102 to the IC 112. In some embodiments, the coupler 104 may be coupled to the IC by a plurality of probes 101. The probes 101 may be part of a probe head or probe package (not shown). The probes 101 may be electrically coupled to test pads and/or bonding pads disposed on the ICs 112. The test pads and/or bonding pads provide electrical connections to an interconnect structure (e.g., wiring) of the ICs. For example, some of the probes may be coupled to pads that are associated with a supply terminal (e.g., Vdd) and ground terminal (e.g., Vss) of the IC 112. Other probes may be coupled to pads associated with input/output (I/O) terminals (e.g., data signals) of the IC 112. As such, the system 100 is operable to apply electrical signals (e.g., stress signal) to the IC 112 and obtain response signals from the IC 112 during wafer-level testing.

The module 106 is configured to determine whether the IC 112 complies with a test criterion after the stress signal 220 is applied to the IC 112. The response signals may be evaluated by the module 106 with respect to the test criterion to determine whether a particular IC 112 is defective or not.

FIG. 3A is an illustration of a single-step power signal for testing a wafer in an existing dynamic voltage stress test method. FIG. 3B is an illustration of a single-step power signal for testing a wafer in an existing elevated voltage stress test method.

Referring to FIG. 3A, a stress signal 312 of the dynamic voltage stress (DVS) test is applied in a single test period 310. The stress signal 312 is composed of a single-sequence signal, which includes a ramp-up stage rising from ground 313 to a test voltage 311, and a ramp-down stage lowering from the test voltage 311 to ground 313. The DVS test utilizes the single-sequence signal to power on the DUI to the pattern setup status and test the DUT at the test voltage 311 the same time period. The test voltage 311 exceeds the normal operating voltages during the test period 310. In the DVS test, it is found that if the voltage level of the test voltage 311 is raised, the screen rate (i.e., the fail count divided by the total device number) for wafer-level testing may be increased. However, the test voltage 311 is used both for pattern setup and defect test at the same time, and the quantity of voltage change of the test voltage 311 is thus limited due to the requirement for pattern setup. In other words, the test voltage 311 may not be able to be increased because of the requirement for pattern setup. Therefore, the screen rate of the DVS test is limited.

To mitigate the problems of the DVS test, the EVS test was introduced. Referring to FIG. 3B, in the EVS test, a stress signal 328 includes a single-step signal 321 and a single-sequence signal 324, which are applied in a first period 320 and a second period 322, respectively. In the first period 320, the single-step signal 321 that rises from ground 323 to a normal operating voltage 325 is applied. In the second period 322 immediately following the first period 320, the single-sequence signal 324 that rises from the normal operating voltage 325 to a test voltage 327 is applied. In the EVS test, it is found that instead of increasing the voltage level of the test voltage 327, the screen rate for wafer-level testing may be increased by increasing the duration of the test voltage 327 during the second period 322. However, in order to obtain a higher screen rate, the second period 322 may be much longer than the test period 310 (shown in FIG. 3A) of the DVS test. For example, the second period 322 of the EVS test may be ten times longer than the test period 310 of the DVS test. Moreover, the screen rate of the ENS test may only be equal to or even less desirable than the DVS test.

The concerns mentioned above may be alleviated according to the present disclosure.

According to some embodiments of the present disclosure, instead of increasing the voltage level or the time period of the test voltage, the screen rate for wafer-level testing may be increased by increasing the quantity of voltage changes in the stress signal 220. Referring back to FIG. 1 and FIG. 2A, in some embodiments of the present disclosure, the signal generator 102 provides the CAVS that the stress signal 220 with the plurality of sequences 221A and 221B, which cause the voltage level to fluctuate between the second voltage level 222 and the third voltage level 224 in the second period 212. Accordingly, the wafer 110 undergoes multiple iterations of voltage change during the second period 212.

As described above, for example, the stress signal 220 includes two sequences 221A and 221B, wherein each sequence 221A and 221B includes the ramp-up stage 2231 and the ramp-down stage 2232. In some embodiments, the signal generator 102 provides the sequence 221A to energize the IC 112 by increasing the voltage of the IC 112 from the first voltage level 200 (i.e., the nominal voltage of the IC) to the second voltage level 222 (i.e., the test voltage). When the ramp-up stage 2231 is applied, a state (i.e., "0" state or "1" state) of at least one semiconductor device in the IC 112 may be changed or toggled. Next, the signal generator 102 continues the sequence 221A to energize the IC 112 by decreasing the voltage subsequent to the ramp-up stage 2231. The ramp-down stage 2232 decreases the voltage of the IC 112 from the second voltage level 222 to the third voltage level 224. When the ramp-down stage 2232 is applied, the state of at least one semiconductor device in the IC 112 may be changed or toggled.

After the sequence 221A, the signal generator 102 provides the sequence 221B to energize the IC 112. The signal generator 102 provides the sequence 221B to energize the IC 112 by increasing the voltage of the IC 112 from the third voltage level 224 to the second voltage level 222. Next, the signal generator 102 continues the sequence 221B to energize the IC 112 by decreasing the voltage of the IC 112 from the second voltage level 222 to ground or the first voltage level 200. As with the sequence 221A, the state of the semiconductor device in the IC 112 may be changed or toggled by the ramp-up stage 2231 and the ramp-down stage 2232 during the sequence 221B.

In summary, according to some embodiments of the present disclosure, during the second period 212, the stress signal 220 may include a plurality of ramp-up stages 2231 and ramp-down stages 2232. It is discovered that the state of the semiconductor devices in the IC 112 may be changed or toggled more easily by the CAVS during the ramp-up stages 2231 and the ramp-down stages 2232. The reason is that the field effect is alternated locally. As a result, the voltage difference of the ramp-up stage 2231 and the ramp-down stages 2232 may cause some of the semiconductor devices in the IC 112 to become a short mode as a fail count. The swap rate of the semiconductor devices in the IC 112 may be increased due to the multiple ramp-up and ramp-down stages. Thus, the screen rate for wafer-level testing may be increased with the plurality of sequences 221A and 221B causing fluctuation of the voltage of the IC 112 between the second voltage level 222 and the third voltage level 224.

Moreover, according to some embodiments of the present disclosure, the swap rate of the semiconductor devices in the IC 112 may be further increased by increasing the amount of the ramp-up stage 2231 from the first voltage level 200 to the second voltage level 222, or by increasing the amount of the ramp-down voltage 2232 from the second voltage level 222 to the third voltage level 224. In other words, the screen rate for wafer-level testing may further be increased by increasing the change in voltage that occurs during the ramp-up stage 2231 or during the ramp-down stage 2232. It should be understood that in order to increase swap rate, any test algorithm that would cover 0/1 state combination is not limited. For example, MBIST (Memory built-in self-test) test may use one CKB (checkerboard) and one inverse CKB test pattern. Logic test pattern may consider a combination of several chain test.

Compared to the DVS test, the test of the present disclosure provides increased screen rate due to larger voltage differences during the ramp-up stage 2231 and the ramp-down stage 2232. In the present disclosure, the test voltage 222 is separated from the pattern setup voltage (i.e., the first voltage level 200). Thus, the test voltage 222 in the present disclosure may be higher than the test voltage 311 (shown in FIG. 3A) of the DVS test. Therefore, the screen rate may be increased.

Compared to the EVS test, since the multiple ramp-up and ramp-down stages of the present disclosure may increase the swap rate of the semiconductor devices in the IC 112, the extended period 322 (shown in FIG. 3B) may be reduced in the present disclosure. Therefore, the duration of the second period 212 in the present disclosure can be reduced and the time consuming concern in the conventional EVS test may be alleviated.

It should be noted that the application of the CAVS is not a limitation of the present disclosure. In some embodiments, the CAVS may be applied in chip probing flow, final test flow, or wafer acceptance test flow at room temperature range (about 25° C. to about 27° C.), or temperature range from about 0° C. to about −40° C., or temperature range from 0° C. to about 125° C.

Figure 4:
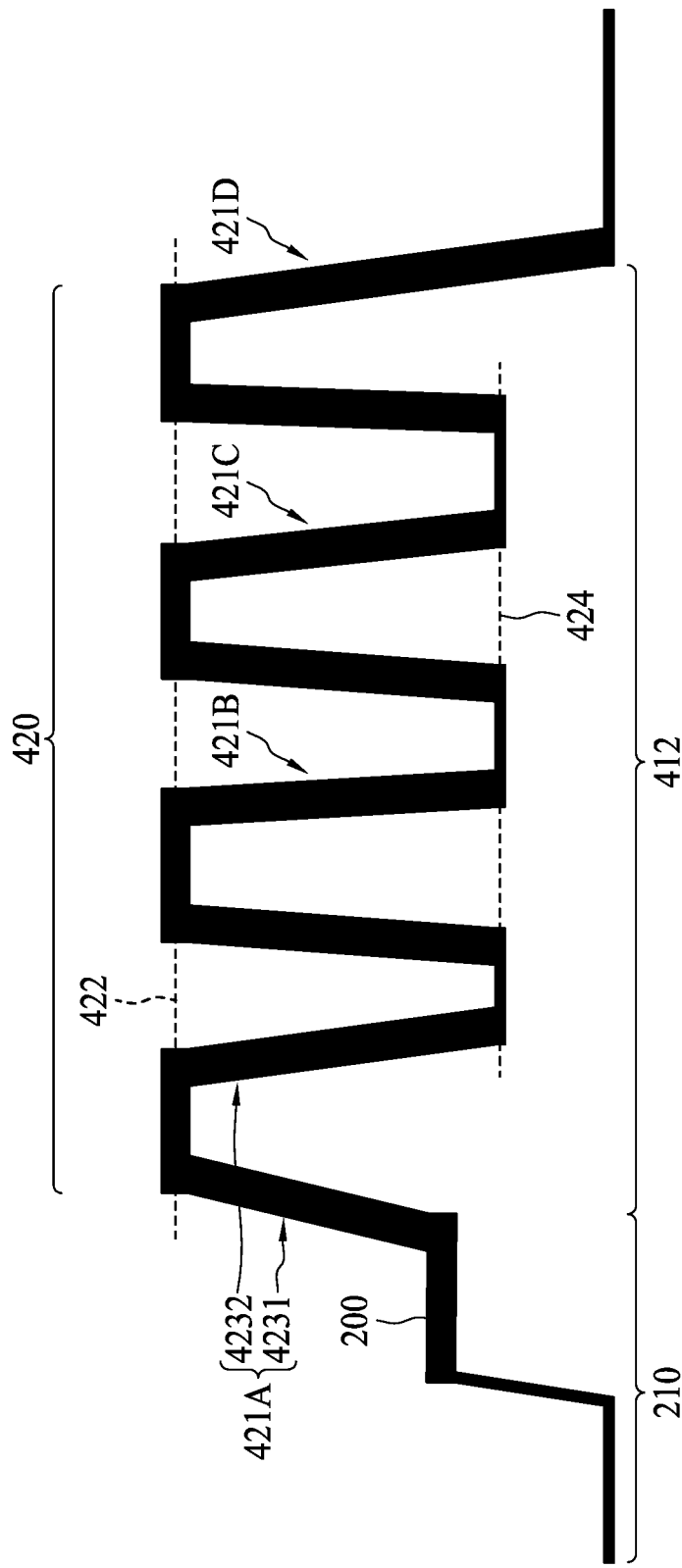
FIG. 4 is an illustration of a multiple-step power signal for testing a wafer in accordance with some embodiments of the present disclosure.

FIG. 4 is an illustration of a multiple-step power signal for testing a wafer in accordance with some embodiments of the present disclosure. The signal generator 102 (shown in FIG. 1) is configured to generate the CAVS including a stress signal 420 during a second period 412 subsequent to the first period 210. The first period 210 is described in FIG. 2A and is omitted here for brevity.

In some embodiments, during the second period 412, the stress signal 420 is generated. The stress signal 420 may include a plurality of sequences 421A, 421B, 421C and 421D. Each sequence 421A, 421B, 421C and 421D includes a ramp-up stage 4231 and a ramp-down stage 4232. Each sequence 421A, 421B, 421C and 421D fluctuates between the second voltage level 422 and the third voltage level 424. A range of the ramp-up stage 4231 or the ramp-down stage 4232 is not limited. In some embodiments, a range of the ramp-up stage 4231 or the ramp-down stage 4232 is between about 0.1 V/ms and about 0.3 V/ms. The voltage is increased from the first voltage level 200 to the second voltage level 422, then decreased from the second voltage level 422 to the third voltage level 424, then increased from the third voltage level 424 to the second voltage level 422, and finally decreased from the second voltage level 422 to ground or the first voltage level 200. It should be noted the second voltage level 422 and the third voltage level 424 may be the same as the second voltage level 222 and the third voltage level 224, respectively, in FIG. 2A.

The second voltage level 422 is higher than the first voltage level 200. The value of the second voltage level 422 is not limited. In some embodiments, the second voltage level 422 may be about 1.3 times higher, about 1.58 times higher, about 2.0 times higher, or about 3.0 times higher than the first voltage level 200. The second voltage level 422 serves as the test voltage. The value of the third voltage level 424 is not limited. The third voltage level 424 is lower than the second voltage level 422. In some embodiments, the third voltage level 424 may be equal to or less than the first voltage level 200. In some embodiments, a voltage difference between the second voltage level 422 and the third voltage level 424 is greater than a voltage difference between the first voltage level 200 and the second voltage level 422. In some embodiments, the third voltage level 424 may be about 0.7 times the first voltage level 200. In some embodiments, the third voltage level 224 may be about 0.9 times the second voltage level 422.

As described above, according to some embodiments of the present disclosure, the screen rate for wafer-level testing may be increased by increasing the quantity of the voltage changes in the stress signal 420. In some embodiments, the signal generator 102 may provide the stress signal 420 with the plurality of sequences 421A, 421B, 421C and 421D fluctuating between the second voltage level 422 and the third voltage level 424 during the second period 412.

As an example, the stress signal 420 includes four sequences 421A, 421B, 421C and 421D and each sequence 421A, 421B, 421C and 421D includes an ramp-up stage 4231 and a ramp-down stage 4232. In some embodiments, the signal generator 102 provides the sequence 421A to energize the IC 112 (shown in FIG. 1) by increasing the voltage of the IC 112 from the first voltage level 200 to the second voltage level 422. When the ramp-up stage 4231 is applied, a state of at least one semiconductor device in the IC 112 may be changed or toggled. Next, the signal generator 102 continues the sequence 421A to energize the IC 112 by decreasing the voltage subsequent to the ramp-up stage 4231. The voltage of the IC 112 is decreased from the second voltage level 422 to the third voltage level 424. When the ramp-down stage 4232 is applied, the state of at least one semiconductor device in the IC 112 may be changed or toggled.

After the sequence 421A, the signal generator 102 provides the sequence 421B to energize the IC 112. The signal generator 102 provides the sequence 421B to energize the IC 112 by increasing the voltage of the IC 112 from the third voltage level 424 to the second voltage level 422. Next, the signal generator 102 continues the sequence 421B to energize the IC 112 by decreasing the voltage of the IC 112 from the second voltage level 422 to the third voltage level 424. As with the sequence 421A, the state of the semiconductor device in the IC 112 may be changed or toggled by the ramp-up stage 4231 and the ramp-down stage 4232 during the sequence 421B. It should be understood that the ramp-down stage 42.32 of the sequence 421B may decrease the voltage of the IC 112 from the second voltage level 422 to another voltage lower than the third voltage level 424. After the sequence 421B, the signal generator 102 provides the sequence 421C to energize the IC 112 in a similar manner, and the description thereof is omitted here for brevity.

After the sequence 421C, the signal generator 102 provides the sequence 421D to energize the IC 112. The signal generator 102 provides the sequence 421D to energize the IC 112 by increasing the voltage of the IC 112 from the third voltage level 424 to the second voltage level 422. Next, the signal generator 102 continues the sequence 421D to energize the IC 112 by decreasing the voltage of the IC 112 from the second voltage level 422 to ground or the first voltage level 200. As with the sequences 421A and 421B, the state of the semiconductor device in the IC 112 may be changed or toggled by the ramp-up stage 4231 and the ramp-down stage 4232 during the sequence 421D.

In summary, according to some embodiments of the present disclosure, during the second period 412, the stress signal 420 may include a plurality of ramp-up stages 4231 and ramp-down stages 4232. It is discovered that the state of the semiconductor devices in the IC 112 may be changed or toggled more easily by the CAVS during the ramp-up stages 4231 and the ramp-down stages 4232. The reason is that the field effect is alternated locally. As a result, the voltage difference of the ramp-up stage 4231 and the ramp-down stages 4232 may cause some of the semiconductor devices in the IC 112 to become a short mode as a fail count. By using the present CAVS, the swap rate of the semiconductor devices in the IC 112 may be increased due to the multiple ramp-up and ramp-down stages. Thus, the screen rate for wafer-level testing may be increased with the plurality of sequences 421A, 421B, 421C and 421D causing fluctuation of the voltage of the IC 112 between the second voltage level 422 and the third voltage level 424. It should be noted that the CAVS may have higher defect coverage on short mode failure but is not limited to only cover short mode failure.

Moreover, according to some embodiments of the present disclosure, the swap rate of the semiconductor devices in the IC 112 may be further increased by increasing the amount of the ramp-up stage 4231 from the first voltage level 200 to the second voltage level 422, or by decreasing the amount of the ramp-down voltage 4232 from the second voltage level 422 to the third voltage level 424. In other words, the screen rate for wafer-level testing may further be increased by increasing the change in voltage that occurs during the ramp-up stage 4231 or during the ramp-down stage 4232.

Figure 5:
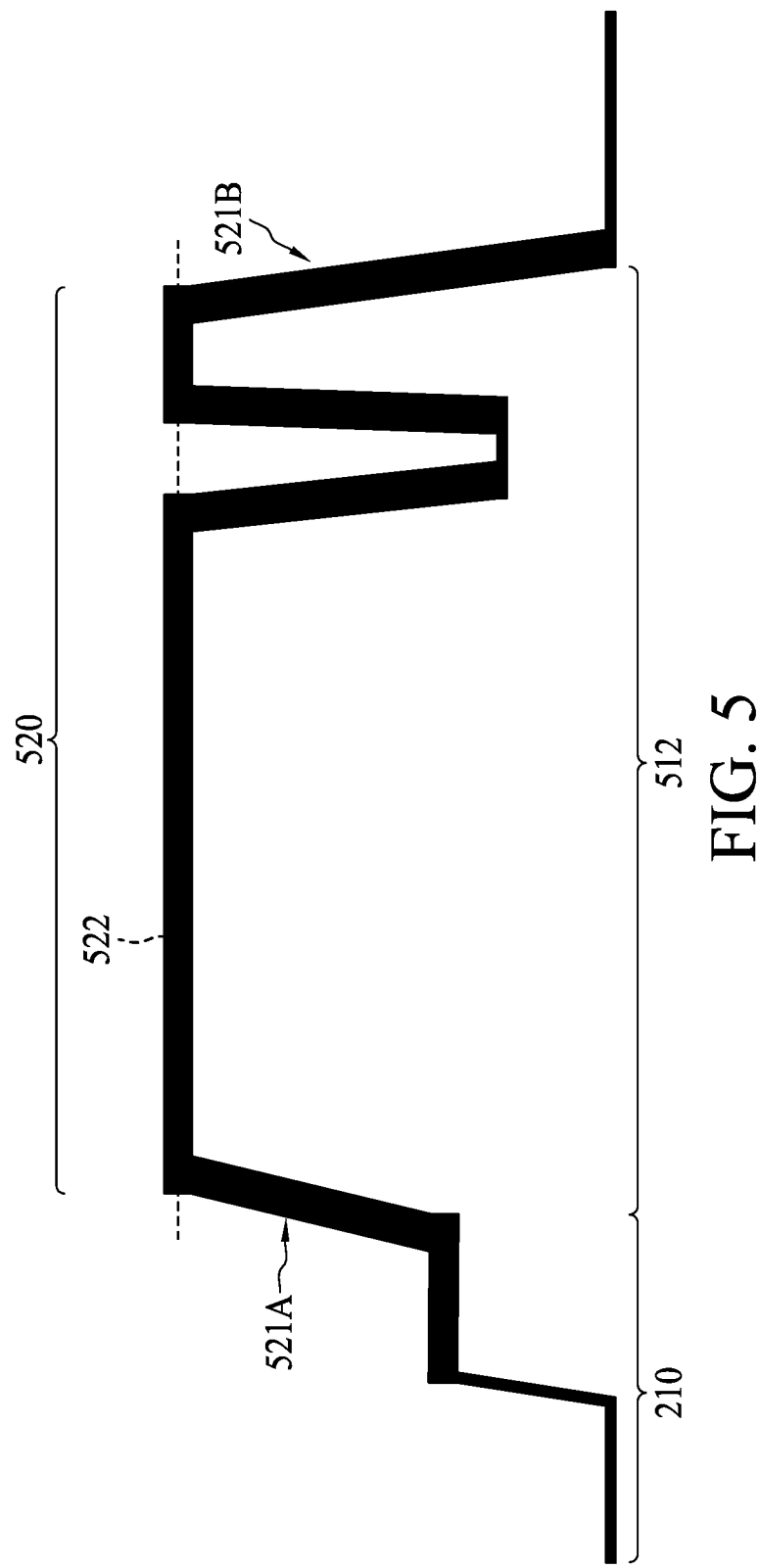
FIG. 5 is an illustration of a multiple-step power signal for testing a wafer in accordance with some embodiments of the present disclosure.

FIG. 5 is an illustration of a multiple-step power signal for testing a wafer in accordance with some embodiments of the present disclosure. The signal generator 102 (shown in FIG. 1) is configured to generate a stress signal 520 during a second period 512 subsequent to the first period 210. The first period 210 is described in FIG. 2A and is omitted here for brevity.

The difference between the stress signal 520 and the stress signal 220 in FIG. 2A is that the stress signal 520 may have longer duration at second voltage level 522 comparing to the stress signal 220. The stress signal 520 may have a sequence 521A with longer duration at second voltage level 522 and a sequence 521B with shorter duration at second voltage level 522. It should be noted that stress signal 520 may have more than one sequence 521B with shorter duration at second voltage level 522. In some embodiments, the duration of the sequence 521B is similar to the duration of the sequences 221A, 221B in FIG. 2A.

Figure 6:
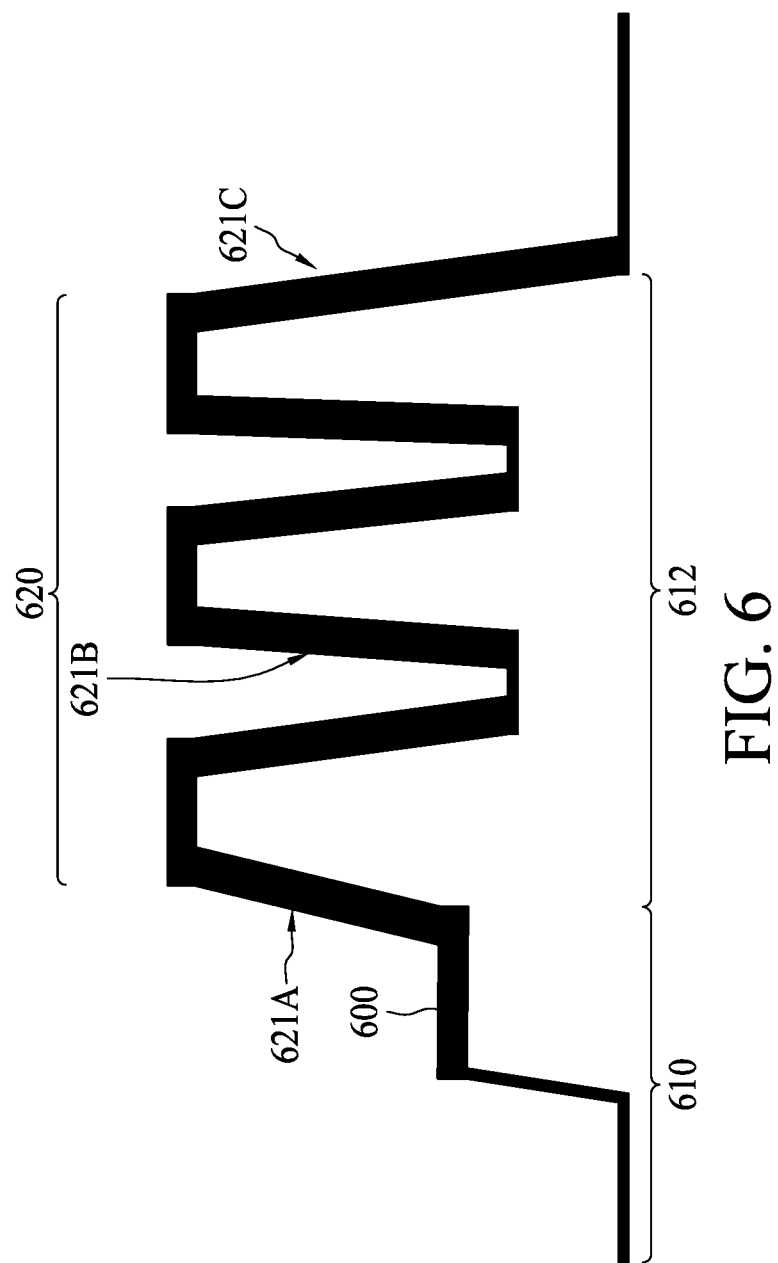
FIG. 6 is an illustration of a multiple-step power signal for testing a wafer in accordance with some embodiments of the present disclosure.

FIG. 6 is an illustration of a multiple-step power signal for testing a wafer in accordance with some embodiments of the present disclosure. The signal generator 102 (shown in FIG. 1) is configured to generate a signal of a first voltage level 600 during a first period 610 and a stress signal 620 during a second period 612 subsequent to the first period 610. The stress signal 620 may include a plurality of sequences 621A, 621B and 621C. The sequences 621A, 621B and 621C are similar to the sequences 421A, 421B and 421C in FIG. 4 and here are omitted for brevity.

The difference between the signal in FIG. 6 and the signal in FIG. 2A is that the first voltage level 600 is higher than the first voltage 200. The value of the first voltage level 600 is not limited. In some embodiments, the first voltage level 600 may be about 1.1 to about 1.3 times the first voltage level 200.

Figure 7:
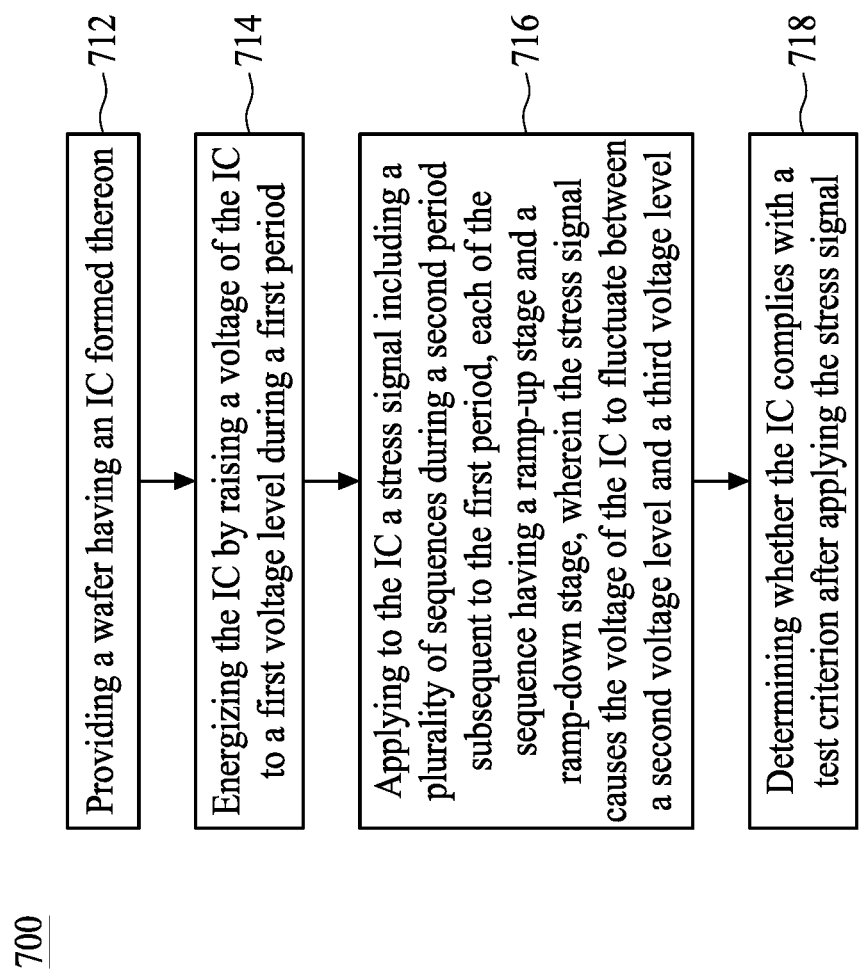
FIG. 7 is a flowchart illustrating a method in accordance with some embodiments of the present disclosure.

FIG. 7 is a flowchart illustrating a method in accordance with some embodiments of the present disclosure. The method 700 of wafer-level testing may include operations 712, 714, 716 and 718. In operation 712, a wafer having an IC formed thereon is provided. In operation 714, the IC is energized by raising the voltage of the IC to a first voltage level during a first period. In operation 716, a stress signal is applied to the IC. The stress signal includes a sequence of multiple ramp-up stages and ramp-down stages during a second period subsequent to the first period. The sequences cause the voltage of the IC to fluctuate between a second voltage level and a third voltage level. In operation 718, it is determined whether the IC complies with a test criterion after applying the stress signal. The detailed descriptions of such operations are similar to the descriptions of the operations shown in FIG. 1, FIG. 2A, and FIG. 4, and thus are omitted for brevity.

Figure 8:
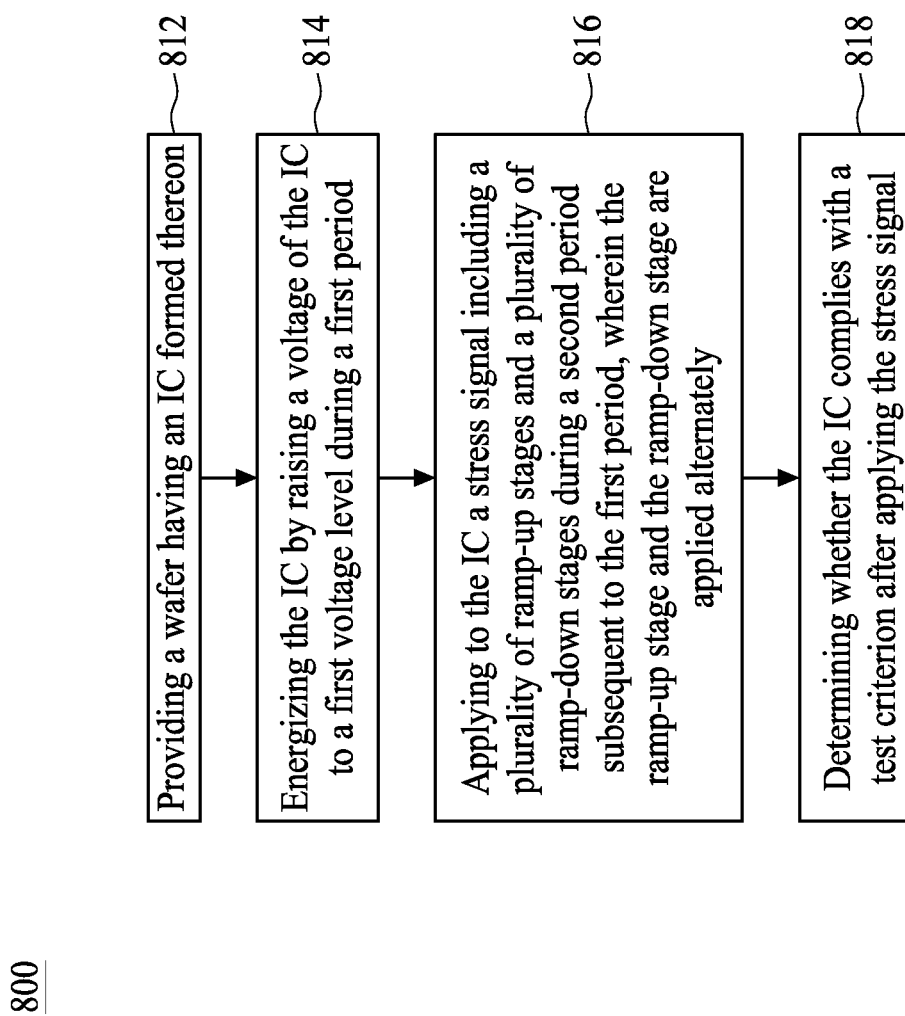
FIG. 8 is a flowchart illustrating a method in accordance with some embodiments of the present disclosure.

FIG. 8 is a flowchart illustrating a method in accordance with some embodiments of the present disclosure. The method 800 of wafer-level testing may include operations 812, 814, 816 and 818. In operation 812, a wafer having an IC formed thereon is provided. In operation 814, the IC is energized by raising the voltage of the IC to a first voltage level during a first period. In operation 816, a stress signal is applied to the IC. The stress signal includes a plurality of ramp-up stages and a plurality of ramp-down stages during a second period subsequent to the first period. The ramp-up stages and the ramp-down stages are applied alternately. In operation 818, it is determined whether the IC complies with a test criterion after applying the stress signal. The detailed descriptions of such operations are similar to the descriptions of the operations shown in FIG. 1, FIG. 2A, and FIG. 4, and thus are omitted for brevity.

In summary, according to some embodiments of the present disclosure, the toggle state (i.e., "0" state or "1" state) of the semiconductor devices in the IC may be changed or toggled more easily by the CAVS during multiple ramp-up and ramp-down stages. The reason is that the field effect is alternated locally. As a result, the voltage difference of the ramp-up stage and the ramp-down stages may cause some of the semiconductor devices in the IC to become a short mode as a fail count. By using the present CAVS, the swap rate of the semiconductor devices in the IC may be increased due to the multiple ramp-up and ramp-down stages. Thus, the screen rate (i.e., the fail count divided by the total device number) for wafer-level testing may be increased. Furthermore, according to some embodiments of the present disclosure, the screen rate for wafer-level testing may be further increased with greater voltage differences of the ramp-up stage or the ramp-down stage.

FIG. 9 is an illustration of inverter circuitry 900 in accordance with some embodiments of the present disclosure. In some embodiments, the inverter circuitry 900 may be included in the IC 112. Referring to FIG. 9, the inverter circuitry 900 includes a PMOS 901 and a NMOS 903. The PMOS 901 has a source, a gate, and a drain. The source of the PMOS 901 is connected to an input terminal Vin (also can be referred to as a power terminal) and configured to receive an input signal (e.g., CAVS). In some embodiments, the gate of the PMOS 901 is connected to another input terminal Vin1. In some embodiments, the drain of the PMOS 901 is connected to an output terminal Vout and configured to output an output signal in response to the input signal. The NMOS 903 has a source, a drain, and a gate. The drain of the NMOS 903 is electrically connected to the drain of the PMOS 901. The source of the NMOS 903 is connected to ground. The gate of the NMOS 903 is electrically connected to the gate of the PMOS 901.

In some embodiments, the output signal in response to the input signal (e.g., stress signal) is monitored at the output terminal Vout to determine whether the inverter circuitry 900 operates normally or not. For example, during the voltage stress tests, the input terminal Vin1 (the gate of each of the PMOS 901 and the NMOS 903) of the inverter circuitry 900 may be connected to ground, and a stress signal (e.g., CAVS) is applied to the input terminal Vin (e.g., the source of the PMOS 901) of the inverter circuitry 900. In the case that the inverter circuitry 900 operates normally, the output signal at the output terminal Vout substantially follows the stress signal at the input terminal Vin, because the gate of each of the PMOS 901 and NMOS 903 are connected to ground (which would turn off the NMOS 903). For example, the output signal of the inverter circuitry 900 would be logically identical with the stress signal. In the case that the inverter circuitry 900 operates abnormally, the output signal of the inverter circuitry 900 may be partially or fully different from the stress signal. For example, the output signal does not follow the stress signal applied to the input terminal Vin.

FIG. 10 illustrates a timing diagram of an input signal 1002 applied to the input terminal Vin of the inverter circuitry 900 and an output signal 1004 obtained at the output terminal Vout of the inverter circuitry 900 as shown in FIG. 9, in accordance with some embodiments of the present disclosure. In some embodiments, the input signal 1002 is the same as or similar to the signal as shown in FIG. 2A, and some of the descriptions for the input signal 1002 are omitted herein for brevity. In other embodiments, the signal as shown in any of FIGS. 2B, 3A, 3B, 4, 5, and 6 can be used as the input signal 1002 for the inverter circuitry 900.

As shown in FIG. 10, in response to the first period 210 and the second period 212 of the input signal 1002, the output signal 1004 includes a first period 1010 and a second period 1012 correspondingly. In some embodiments, the output signal 1004 rises to a first voltage level 1020 during a first period 1010 in response to the first voltage level 200 of the input signal 1002 during the first period 210, which is monitored to be logically identical to the input signal 1002. During the second period 1012 subsequent to the first period 1010, the output signal 1004 is partially different from the input signal 1002. For example, the logical difference between the input signal 1002 and the output signal 1004 occurs at the rising edge (e.g., the sequence 221A) of the stress signal 220 of the input signal 1002. In response to the sequence 221A of the stress signal 220 of the input signal 1002, the output signal 1004 ramps down to a lower voltage level 1026 from the first voltage level 1020. After the duration of the lower voltage level 1026, the output signal 1004 ramps up to a second voltage level 1022. The second voltage level 1022 is logically identical to the second voltage level 222 of the input signal 1002. In response to the ramp-down stage of the first pulse 221A, the output signal 1004 ramps down to a third voltage level 1024. The third voltage level 1024 is logically identical to the third voltage level 224 of the input signal 1002. Then, the output signal 1004 is logically identical with the input signal 1002 in the rest of the second period.

In some embodiments, the logical difference as shown in FIG. 10 between the input signal 1002 and the output signal 1004 may indicate an abnormal device structure (or an unnatural leakage or damage) in the inverter circuitry 900. Such abnormal device structure (or an unnatural leakage or damage) may appear due to the stress signal applied to the IC. In some embodiments, the logical difference between the input signal 1002 and the output signal 1004 could indicate the leakage or damage between the gate and the drain of the semiconductor structure (e.g., the PMOS 901 or the NMOS 903) caused by process deviation or an insufficient margin. The abnormal device structure including, but not limited to, Gate, Source, Drain, Contact, Inter layer dielectric (ILD), Fin, Metal gate, epitaxy (EPI), etc., could be detected by monitoring the logical difference between the input signal 1002 and the output signal 1004. The unnatural damage may include a profile distortion of a metal gate of a semiconductor device, a contact distortion of a semiconductor device, or an impurity in a dielectric of a semiconductor device. In some embodiments, the input signal 1002 (e.g., the stress signal) as shown in FIG. 10 may be applied to any other logical circuitry to check whether there is any defect in the logical circuitry based on the output signal.

Figure 11A:
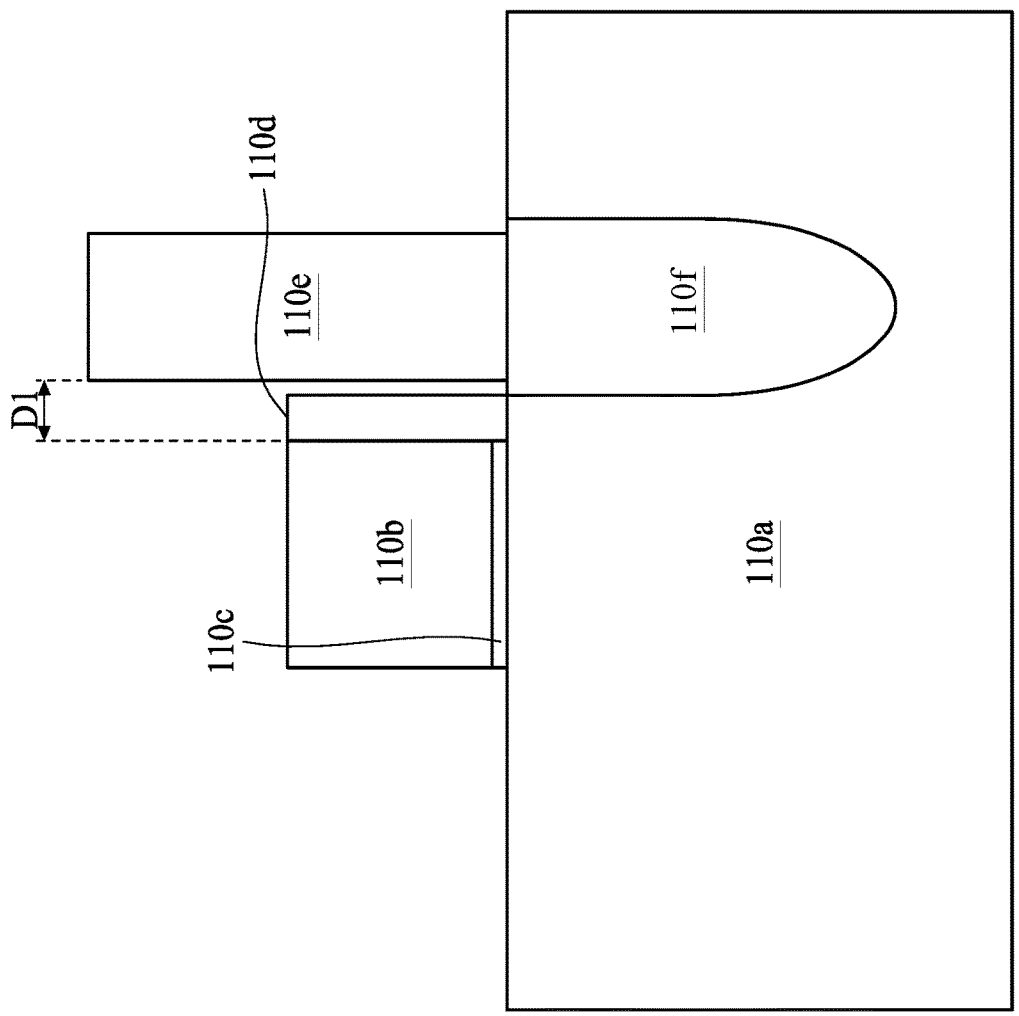
FIG. 11A illustrates a semiconductor structure in accordance with some embodiments of the present disclosure.

FIG. 11A illustrates a semiconductor structure 11A in accordance with some embodiments of the present disclosure. In some embodiments, the semiconductor structure 11A is part of a transistor. For example, the semiconductor structure 11A may be part of the PMOS 901 or the NMOS 903 as shown in FIG. 9. The semiconductor structure 11A includes a substrate 110a, a gate 110b, a gate dielectric 110c, a spacer 110d, a contact 110e, and an epitaxy 110f.

Referring to the circuitry of FIG. 9, the epitaxy 110f may be the source of either the PMOS 901 or the NMOS 903. In some embodiments, the epitaxy 110f may be the drain of either the PMOS 901 or the NMOS 903. In some embodiments, the contact 110e may be a source contact of the PMOS 901 connected to the input terminal Vin. In some embodiments, the contact 110e may be a drain contact of the PMOS 901 connected to the output terminal Vout. In some embodiments, the contact 110e may be a drain contact of the NMOS 903 connected to the drain of the PMOS 901. In some embodiments, the contact 110e may be a source contact of the NMOS 903 connected to the ground. The gate 110b may be the gate of the PMOS 901 or the NMOS 903 connected another input terminal Vin1.

The gate dielectric 110c is disposed on the substrate 110a. The gate 110b is disposed on the gate dielectric 110c. The spacer 110d is disposed on the substrate 110a. The spacer 110d is disposed beside the gate 110b. The spacer 110d may be in contact with the gate 110b and the gate dielectric 110c. The contact 110e is disposed on the substrate 110a. The contact 110e is disposed beside the spacer 110d. The contact 110e is physically spaced apart from the spacer 110d. For example, there is a gap between the contact 110e and the spacer 110d. In some embodiments, a distance D1 between the contact 110e and the gate 110b is less than 3 nm.

If the distance between the contact and the gate of a transistor is less than 3 nm, it is difficult to perform a voltage stress test on said transistor using existing techniques. Since the size of the semiconductor device is getting smaller, it is difficult to test this kind of structure. The escape defect rate of the result of performing the voltage stress test would be lower by using the methods of the present disclosure. In other words, it is more accurate and reliable to test a transistor, which has the contact and the gate less than 3 nm, with the method of the present disclosure. In some embodiments, by using the stress signal as shown in FIG. 2A and monitoring the output signal as shown in FIGS. 9 and 10, the voltage stress test can be carried out for any transistor having a gate to contact spacing less than 3 nm.

Figure 11B:
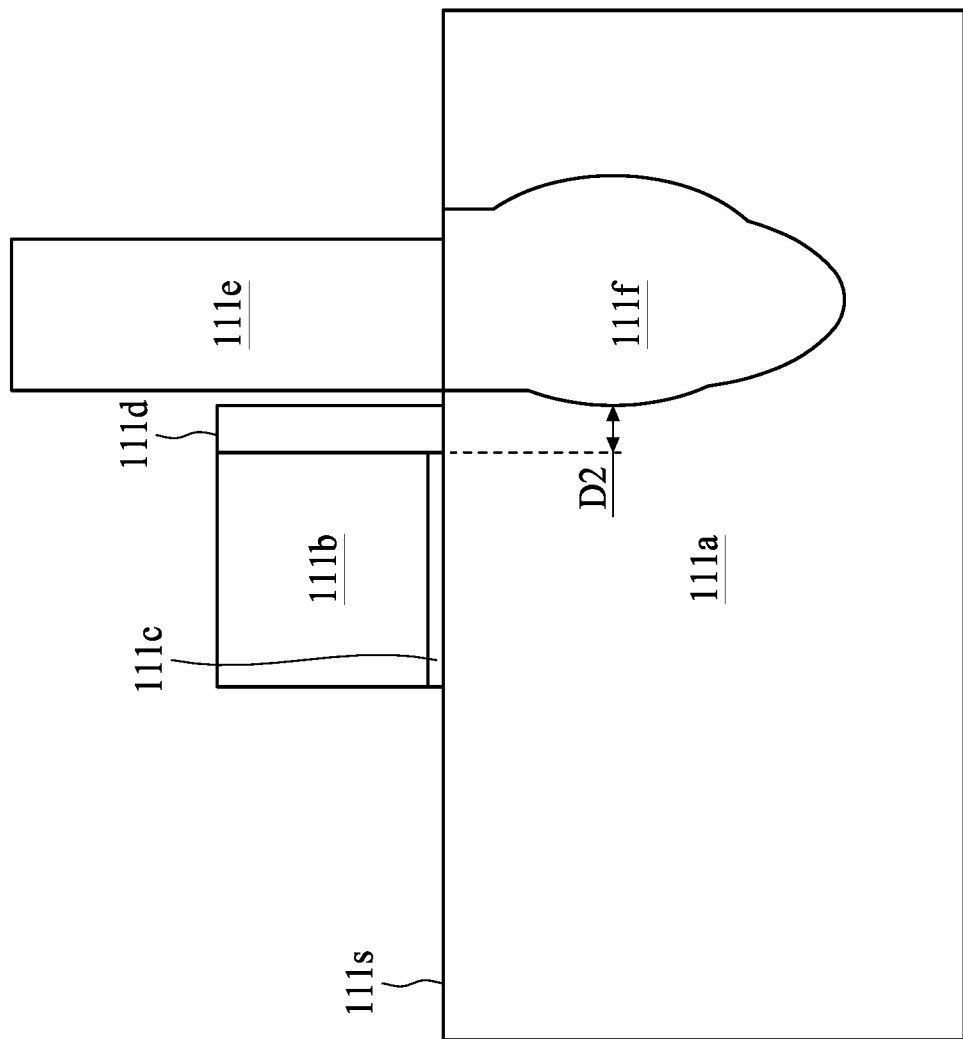
FIG. 11B illustrates a semiconductor structure in accordance with some embodiments of the present disclosure.

FIG. 11B illustrates a semiconductor structure 11B in accordance with some embodiments of the present disclosure. In some embodiments, the semiconductor structure 11B is part of a transistor. For example, the semiconductor structure 11B may be part of the PMOS 901 or the NMOS 903 as shown in FIG. 9. The semiconductor structure 11B includes a substrate 111a, a gate 111b, a gate dielectric 111c, a spacer 111d, a contact 111e, and an epitaxy 111f.

Referring to the circuitry of FIG. 9, the epitaxy 111f may be the source of either the PMOS 901 or the NMOS 903. In some embodiments, the epitaxy 111f may be the drain of either the PMOS 901 or the NMOS 903. In some embodiments, the contact 111e may be a source contact of the PMS 901 connected to the input terminal Vin. In some embodiments, the contact 111e may be a drain contact of the PMOS 901 connected to the output terminal Vout. In some embodiments, the contact 111e may be a drain contact of the NMOS 903 connected to the drain of the PMOS 901. In some embodiments, the contact 111e may be a source contact of the NMOS 903 connected to the ground. The gate 111b may be the gate of the PMOS 901 or the NMOS 903 connected another input terminal Vin1.

The substrate 111a has a surface 111s. The gate dielectric 111c is disposed on the surface 111s of the substrate 111a. The gate 111b is disposed on the gate dielectric 111c. The spacer 111d is disposed on the surface 111s of the substrate 111a. The spacer 111d is disposed beside the gate 111b. The spacer 111d may be in contact with the gate 111b and the gate dielectric 111c. The contact 111e is disposed on the substrate 111a. The contact 111e is disposed beside the spacer 111d. The contact 111e is physically spaced apart from the spacer 111d. For example, there is a gap between the contact 111e and the spacer 111d. The epitaxy 111f is disposed within the substrate 111a. The epitaxy 111f is under the contact. In some embodiments, a minimum distance D2 between a projection line of the gate 111b on the substrate lls of the substrate 111a and a projection line of the epitaxy 111f on the surface Ms of the substrate 111a is less than 1 nm.

If the minimum distance between a projection line of the gate on the substrate and a projection line of the epitaxy on the substrate is less than 1 nm, it is difficult to perform a voltage stress test on said transistor using existing techniques. Since the size of the semiconductor device is getting smaller, it is difficult to test this kind of structure. The escape defect rate of the result of performing the voltage stress test using existing techniques would be lower by using the methods of the present disclosure. In other words, it is more accurate and reliable to test a transistor, which has a projection line of the gate on the substrate and a projection line of the epitaxy on the substrate less than 1 nm, with the method of the present disclosure. By using the stress signal as shown in FIG. 2A and monitoring the output signal as shown in FIGS. 9 and 10, the voltage stress test can be carried out for any transistor having a gate to epitaxy spacing less than 1 nm.

According to some embodiments, a method is provided. The method includes providing a device under test (DUT) having an input terminal and an output terminal; applying a voltage having a first voltage level to the input terminal of the DUT during a first period; applying a stress signal to the input terminal of the DUT during a second period subsequent to the first period; obtaining an output signal in response to the stress signal at the output terminal of the DUI; and comparing the output signal with the stress signal. The stress signal includes a plurality of sequences, each having a ramp-up stage and a ramp-down stage. The stress signal has a second voltage level and a third voltage level.

According to other embodiments, a method is provided. The method includes providing a device under test (DUT) having an input terminal and an output terminal; applying a stress signal to the input terminal of the DUT; obtaining an output signal in response to the stress signal at the output terminal of the DUT; comparing the output signal with the stress signal; and determining whether the DUT has an abnormal structure based on a result of the comparison between the output signal and the stress signal. The output signal includes a plurality of sequences, each having a ramp-up stage and a ramp-down stage. The output signal has a first voltage level and a second voltage level.

According to other embodiments, a semiconductor device is provided. The semiconductor device includes a first input terminal configured to receive a stress signal and an output terminal configured to generate an output signal in response to the stress signal. The semiconductor device further includes a substrate, a gate, and a contact. The gate is disposed on the substrate. The contact is disposed on the substrate and beside the gate. The contact is electrically connected to the first input terminal or the output terminal. A distance between the gate and the contact is less than 3 nanometer (nm).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
applying a voltage having a first voltage level to an input terminal of a device under test (DUT) during a first period;
applying a stress signal to the input terminal of the DUT during a second period subsequent to the first period, the stress signal including a first sequence and a second sequence, the first sequence having a first ramp-up stage and a first ramp-down stage, and the second sequence having a second ramp-up stage and a second ramp-down stage, wherein the stress signal ramps to a second voltage level during the first ramp-up stage and ramps down to a third voltage level during the first ramp-down stage, and wherein the stress signal ramps to the second voltage level during the second ramp-up stage and ramps down to ground during the second ramp-down stage, wherein the second voltage level and the third voltage level are both different from the first voltage level, wherein the second voltage level is greater than the third voltage level;
obtaining an output signal in response to the stress signal at an output terminal of the DUT; and
comparing the output signal with the stress signal.

2. The method of claim 1, further comprising determining whether the DUT has an abnormal structure based on a result of the comparison between the output signal and the stress signal.

3. The method of claim 2, wherein the DUT is determined as having the abnormal structure in the case that the output signal is logically different from the stress signal in a same time domain.

4. The method of claim 3, wherein the output signal is partially logically different from the stress signal in the same time domain.

5. The method of claim 3, wherein the output signal is fully logically different from the stress signal in the same time domain.

6. The method of claim 1, wherein the second voltage level is 1.3 to 3.0 times higher than the first voltage level.

7. The method of claim 1, wherein the third voltage level is 0.7 times the first voltage level to 0.9 times the second voltage level.

8. The method of claim 1, wherein the DUT comprises:
a PMOS having a source connected to the input terminal of the DUT, a gate, and a drain connected to the output terminal of the DUT; and
a NMOS having a source connected to ground, a gate connected to the gate of the PMOS, and a drain connected to the output terminal of the DUT.

9. A method, comprising:
applying an initial signal to an input terminal of a device under test (DUT) in a first period;
applying a stress signal to the input terminal of the DUT in a second period;
obtaining an output signal in response to the initial signal and the stress signal at an output terminal of the DUT, the output signal in response to the initial signal having a first voltage level, the output signal in response to the stress signal including a first sequence and a second sequence, the first sequence having a first ramp-up stage and a first ramp-down stage, and the second sequence having a second ramp-up stage and a second ramp-down stage, wherein the output signal ramps to a second voltage level during the first ramp-up stage and ramps down to a third voltage level during the first ramp-down stage, and wherein the output signal ramps to the second voltage level during the second ramp-up stage and ramps down to ground during the second ramp-down stage, wherein the second voltage level and the third voltage level are both different from the first voltage level, wherein the second voltage level is greater than the third voltage level; and comparing the output signal with the stress signal.

10. The method of claim 9, wherein the third voltage level is lower than the first voltage level.

11. The method of claim 9, wherein the second voltage level is 1.3 to 3.0 times higher than the first voltage level.

12. The method of claim 9, wherein the third voltage level is 0.7 times the first voltage level to 0.9 times the second voltage level.

13. The method of claim 9, wherein the DUT is determined as having the abnormal structure in the case that the output signal is logically different from the stress signal in a same time domain.

14. The method of claim 9, wherein the DUT comprises:
a PMOS having a source connected to the input terminal of the DUT, a gate, and a drain connected to the output terminal of the DUT; and
a NMOS having a source connected to ground, a gate connected to the gate of the PMOS, and a drain connected to the output terminal of the DUT.

15. A semiconductor device, comprising:
a first input terminal configured to receive a stress signal and to receive a voltage having a third voltage level prior to receiving the stress signal;
an output terminal configured to generate an output signal in response to the stress signal;
a substrate;
a gate disposed on the substrate;
a contact disposed on the substrate and beside the gate; and
an epitaxy disposed within the substrate and under the contact, wherein a minimum distance between a projection line of the gate on the substrate and a projection line of the epitaxy on the substrate is less than 1 nm, wherein the output signal in response to the stress signal includes a plurality of pulses, wherein the output signal has a first voltage level and a second voltage level.

16. The semiconductor device of claim 15, further comprising:
a spacer disposed on the substrate and between the gate and the contact; and
a gate dielectric disposed between the gate and the substrate.

17. The semiconductor device of claim 15, wherein the contact is electrically connected to a drain or a source of the semiconductor device.

18. The semiconductor device of claim 15, wherein the first voltage level is higher than the second voltage level and the third voltage level.

19. The semiconductor device of claim 18, wherein the first voltage level is 1.3 to 3.0 times higher than the third voltage level.

* * * * *